United States Patent
Otaka

[11] Patent Number: 6,148,181
[45] Date of Patent: Nov. 14, 2000

[54] RADIO APPARATUS ADAPTED TO REMOVE IMAGE COMPONENTS FROM LOCAL OSCILLATING SIGNALS

[75] Inventor: Shoji Otaka, Yokohama, Japan

[73] Assignee: Kabushiki Kaisha Toshiba, Kawasaki, Japan

[21] Appl. No.: 09/274,348

[22] Filed: Mar. 23, 1999

[30] Foreign Application Priority Data

Mar. 25, 1998 [JP] Japan .................................. 10-077220
Mar. 16, 1999 [JP] Japan .................................. 11-070481

[51] Int. Cl.[7] ...................................................... H04B 1/40
[52] U.S. Cl. ............................... 455/86; 455/76; 455/285; 455/302
[58] Field of Search .................................. 455/85, 86, 76, 455/78, 285, 302, 315

[56] References Cited

U.S. PATENT DOCUMENTS

4,731,875  3/1988  Mizukami et al. ...................... 455/302

Primary Examiner—Lee Nguyen
Attorney, Agent, or Firm—Oblon, Spivak, McClelland, Maier & Neustadt, P.C.

[57] ABSTRACT

A radio apparatus comprises a local oscillation signal generator which includes a first local oscillation unit for generating a first local oscillation signal having a frequency $f_{LO1}$ to be divided into third and fourth local oscillation signals having a phase difference of 90 degrees and a second local oscillation unit for generating a second local oscillation signal having a frequency $f_{LO2}$ to be divided into fifth and sixth local oscillation signals having a phase difference of 90 degrees. The local oscillation signal generator includes an arithmetic unit for adding or subtracting the multiplication result of the third and fifth local oscillation signals and the multiplication result of the fourth and sixth local oscillation signals to obtain a local oscillation signal from which an image signal is removed.

16 Claims, 9 Drawing Sheets

RADIO APPARATUS ADAPTED TO REMOVE IMAGE COMPONENTS FROM LOCAL OSCILLATING SIGNALS

BACKGROUND OF THE INVENTION

The present invention relates to a radio apparatus such as a portable radio.

Mobile communication apparatuses typified by portable telephones have been enthusiastically developed. These communication apparatuses are carried by users or mounted in cars and the like, and hence must be reduced in size and weight. For this reason, as parts constituting such a radio apparatus, monolithic integrated circuits, which are more suitable for reductions in size and weight than a conventional hybridization structure formed by connecting many parts, are strongly required. On the other hand, demands have arisen for reductions in the costs of radios as well as reductions in the sizes of parts. IC technology leads to reductions in the costs of radios.

Among these radio apparatuses, there is a conventional transceiver apparatus using the superheterodyne scheme, e.g., a transceiver apparatus using the TDD (Time Division Duplex) scheme of time-divisionally performing transmission and reception. There will now be described a conventional transceiver hereinafter.

Two quadrature baseband signals generated by a baseband signal generator are output from a baseband signal processor through some appropriate band limit filter. These two baseband signals are input to a quadrature modulator comprised of a multiplier and an adder to modulate a second local oscillation signal (frequency $f_{LO2}$). At this time, the second local oscillation signal is divided into two quadrature local oscillation signals by a quadrature phase shifter. The signals are then input to the quadrature modulator. Since this modulated signal, i.e., intermediate frequency signal (IF signal), generally includes unwanted harmonics, the signal is input to an up-converter through a low-pass filter or band-pass filter. The up-converter multiplies a first local oscillation signal having a frequency $f_{LO1}$ [Hz] and the modulated signal (IF signal) to generate a modulated signal having a frequency $f_{LO1}+f_{LO2}$ [Hz] or $f_{LO1}-f_{LO2}$ [Hz], i.e., radio frequency signal (RF signal). One of these signals is used as a desired wave, but the other signal is an unwanted image signal. If the RF signal having the frequency $f_{LO1}+f_{LO2}$ [Hz] is used as a desired wave, the image signal having the frequency $f_{LO1}-f_{LO2}$[Hz] is removed by an image rejection bandpass filter. The desired wave is amplified to a predetermined power level by a power amplifier. The amplified wave is radiated from an antenna through an RF switch (TX/RX switch).

In a receiver unit, the received RF signal is input to a low-noise amplifier through an antenna, an RF switch, and a bandpass filter. The received RF signal amplified by the low-noise amplifier is input to a down-converter through an image rejection bandpass filter. The down-converter multiplies the received signal by a first local oscillation signal to frequency-convert the received signal into an IF signal. The IF signal is input to a quadrature demodulator made up of a divider and a multiplier through a bandpass filter. A quadrature local oscillation signal having the frequency $f_{LO2}$ [Hz] is input to this quadrature demodulator as in the case with a transmitter unit. Outputs Ich(RX) and Qch(RX) from the quadrature demodulator are input to a baseband signal processor. As a result, the received signal is demodulated.

According to the above conventional radio apparatus, when a local oscillation signal is to be modulated by a baseband signal, the local oscillation signal is divided into two quadrature signals by the quadrature phase shifter. The two signals are input to the quadrature modulator. Since this modulated signal (IF signal) generally includes unwanted harmonics, the signal is input to the up-converter after these unwanted harmonics are removed. This up-converter multiplies the modulated signal (IF signal) by the first local oscillation signal having the frequency $f_{LO1}$ [Hz] to generate a modulated signal (RF signal) having the frequency $f_{LO1}+f_{LO2}$ [Hz] or $f_{LO1}-f_{LO2}$ [Hz]. One of these signals is used as a desired wave, but the other signal is an unnecessary image signal. To remove this unnecessary image signal, this signal is processed by the image removing filter. This image filter hinders reductions in the size and cost of the radio apparatus.

It is, therefore, an object of the present invention to provide a radio apparatus which requires no external image removing filter and can achieve reductions in size and cost.

BRIEF SUMMARY OF THE INVENTION

According to the present invention, there is provided a radio apparatus comprising a local signal generator made up of an oscillation circuit for generating at least a first local oscillation signal having a first frequency $f_{LO1}$ [Hz] and a second local oscillation signal having a second frequency $f_{LO2}$ [Hz], a first signal generator for generating third and fourth local oscillation signals having from the first local oscillation signal a phase difference of 90° therebetween, and a second signal generator for generating from the second local oscillation signal fifth and sixth local oscillation signals having a phase difference of 90° therebetween, and at least one of a transmitter unit having a modulation function using a seventh local oscillation signal generated by multiplying the third local oscillation signal by the fifth local oscillation signal, multiplying the fourth local oscillation signal by sixth local oscillation signal, and adding or subtracting the two products, and a receiver unit having a demodulation function using the seventh local oscillation signal.

In addition, according to the present invention, there is provided a radio apparatus comprising an oscillation circuit for generating a first local oscillation signal having a first frequency $f_{LO1}$ [Hz] and a second local oscillation signal having a second frequency $f_{LO2}$ [Hz], a first signal generator for generating from the first local oscillation signal third and fourth local oscillation signals having a phase difference of 90° therebetween, a second signal generator for generating from the second local oscillation signal fifth and sixth local oscillation signals having a phase difference of 90° therebetween, and an arithmetic unit for generating a seventh local oscillation signal by adding or subtracting a product of the third and fifth local oscillation signals and a product of the fourth and fifth local oscillation signals, and supplying eighth and ninth local oscillation signals having a phase difference of 90° therebetween and generated by using the seventh local oscillation signal, as local oscillation signals, to transmitter and receiver units.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
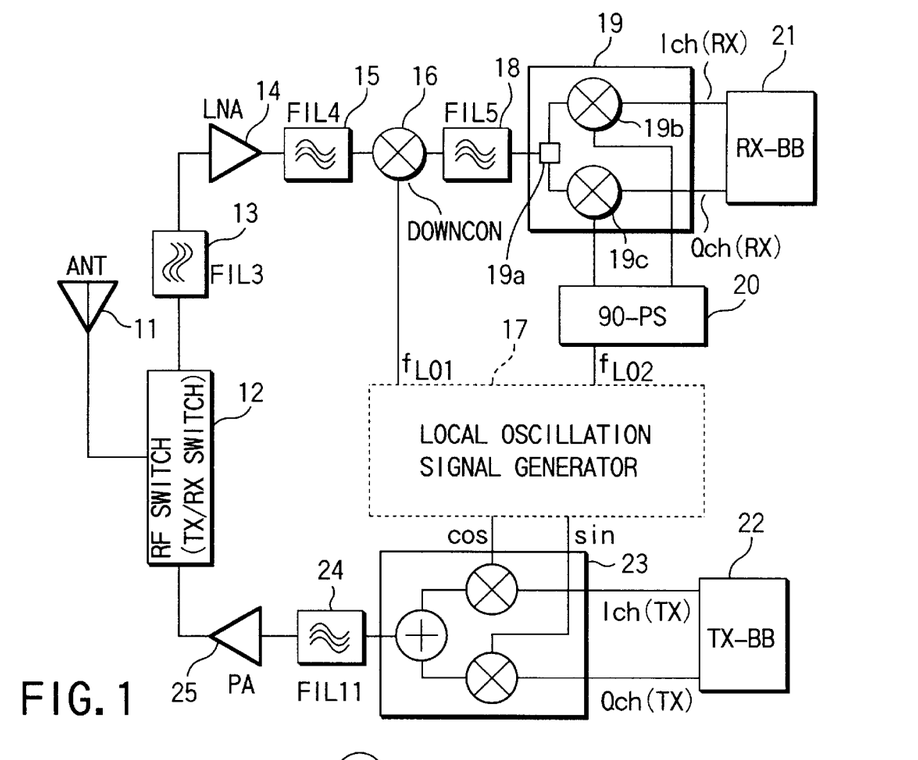
FIG. 1 is a block diagram showing a radio apparatus using a local oscillation signal generator according to an embodiment of the present invention, in which the direct conversion scheme is used for the transmission system, and the superheterodyne scheme is used for the reception system.

According to the radio apparatus shown in FIG. 1, an antenna 11 is coupled to an RF switch (TX/RX switch) 12 for switching the reception and transmission systems of the radio apparatus.

In the reception system, the RF switch 12 is connected to one input terminal of a down-converter 16 through a bandpass filter (FIL3) 13, a low-noise amplifier (LNA) 14, and a bandpass filter (FIL4) 15. The other input terminal of the down-converter 16 receives a first local oscillation signal $f_{LO1}$ [Hz] from a local oscillation signal generator 17. The output terminal of the down-converter 16 is connected to a quadrature demodulator 19, assembled by a divider (i.e., node) 19a and a multiplier 19b, through a bandpass filter (FIL5) 18. A second local oscillation signal having a frequency $f_{LO2}$ [Hz] is further input to the quadrature demodulator 19 via a quadrature phase shifter 20. The signals generated by the quadrature phase shifter 20 and having a phase difference of 90° therebetween are to the multipliers 19b and 19c, respectively. Outputs Ich(RX) and Qch(RX) from the quadrature demodulator 19 are input to a baseband processor (RX-BB) 21. With this operation, the received signal is demodulated.

In the transmission system, a baseband signal processor (TX-BB) 22 is connected to the RF switch 12 through a quadrature modulator 23, a bandpass filter (FIL11) 24, and a power amplifier (PA) 25.

In this transmission system, the local oscillation signal supplied from the local oscillation signal generator 17 is a signal having frequency $f_{LO1}+f_{LO2}$ [Hz] generated by multiplying a first local oscillation signal ($f_{LO1}$ [Hz]) by the second local oscillation signal ($f_{LO2}$ [Hz]). An image signal having a frequency $f_{LO1}-f_{LO2}$ [Hz] is removed by signal processing in the local oscillation signal generator 17. In this case, the signal having the frequency $f_{LO1}+f_{LO2}$ is used as a desired local oscillation signal, but the signal having the frequency $f_{LO1}-f_{LO2}$ may be used as a desired local oscillation signal as the case may be. In the latter, the signal having the frequency $f_{LO1}+f_{LO2}$ is removed by signal processing. Upon removal of the image signal, the signal having the frequency $f_{LO1}+f_{LO2}$ is divided into quadrature signals through the quadrature phase shifter. These signals are output to the quadrature modulator 23.

The quadrature modulator 23 modulates the local oscillation signals having the frequency $f_{LO1}+f_{LO2}$ with the baseband signals Ich(RX) and Qch(TX). The modulated signal is radiated from the antenna 11 through the filter 24, which is a low-pass filter or bandpass filter, the power amplifier 25, and the RF switch 12. According to the principle of the present invention, the bandpass filter 24 is not required and can be omitted if the characteristics of the modulator permit.

Figure 2:
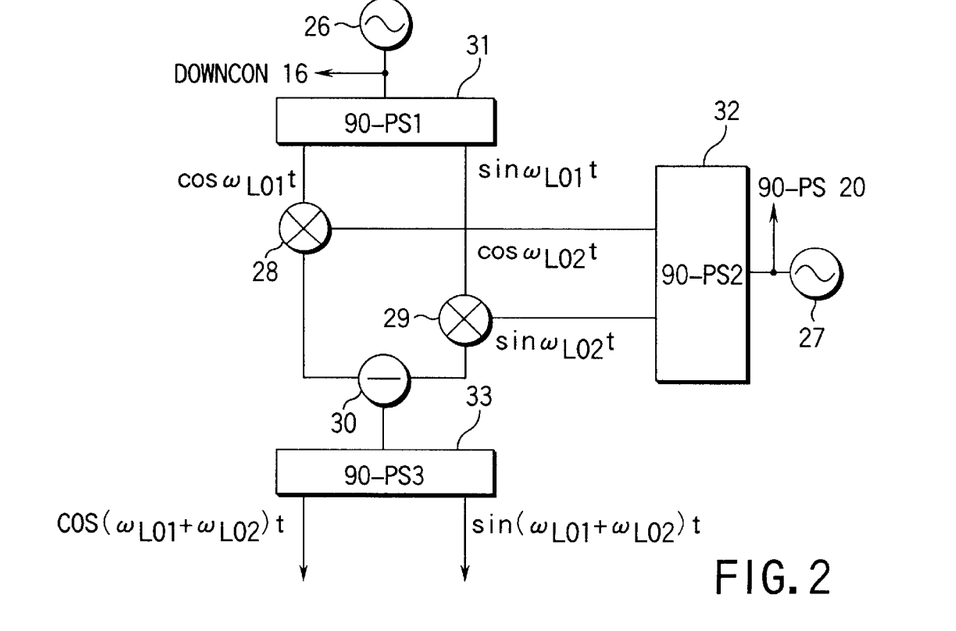
FIG. 2 is a circuit diagram showing the local oscillation signal generator according to an embodiment of the present invention.

The local oscillation signal generator 17 will be described next with reference to FIG. 2. Referring to FIG. 2, local signal oscillators 26 and 27 generates the first and second local oscillation signals having the frequencies $f_{LO1}$ and $f_{LO2}$ [Hz], respectively. The first local oscillation signal of the frequency $f_{LO1}$ is supplied to the down-converter 16, and the second local oscillation signal of the frequency $f_{LO2}$ [Hz] is input to the quadrature phase shifter 20.

A quadrature phase shifter (90-PS1) 31 receives the first local oscillation signal having the frequency $f_{LO1}$ [Hz] and outputs signals cos $\omega_{LO1}t$ and sin $\omega_{LO1}t$. Meanwhile, a quadrature phase shifter 32 receives the second local oscillation signal having the frequency $f_{LO2}$ [Hz] and outputs signals cos $\omega_{LO2}t$ and sin $\omega_{LO2}t$. The signals cos $\omega_{LO1}t$ and cos $\omega_{LO2}t$ are multiplied by a multiplier 28. The signals sin $\omega_{LO1}t$ and sin $\omega_{LO2}t$ are multiplied by a multiplier 29. The results of the multipliers 28 and 29 are subtracted from each other by a subtractor 30. In other words, the image signal having the frequency $f_{LO1}-f_{LO2}$ [Hz] is suppressed by multiplying and subtracting these signals by $$\cos(\omega_{LO1}t)\cos(\omega_{LO2}t)-\sin(\omega_{LO1}t)\sin(\omega_{LO2}t)=\cos[(\omega_{LO1}+\omega_{LO2})t] \quad (1)$$

and only a desired local oscillation signal having the frequency $f_{LO1}+f_{LO2}$ [Hz] is generated. In the actual manufacturing process, a phase error and an amplitude error are caused by manufacturing variations of the quadrature phase shifter, and an unwanted image signal and local oscillation signals having the frequencies $f_{LO1}$ and $f_{LO2}$ [Hz] leak.

However, even with these manufacturing variations, each unwanted signal can be attenuated by 40 dB or more with respect to a desired signal.

FIGS. 3A, 3B, 3C, and 3D show how an image signal is removed in this embodiment.

Figure 3A:
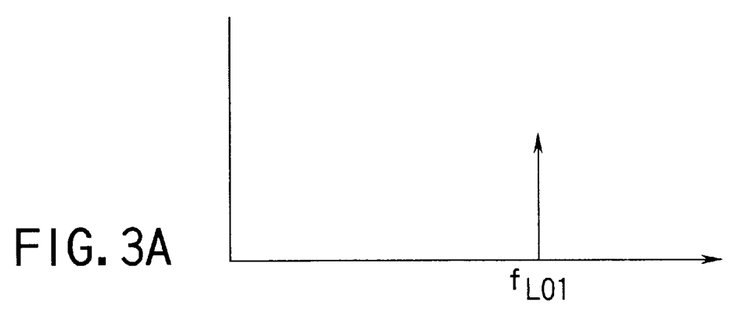
FIGS. 3A to 3D are graphs for explaining removal of an image signal.
Figure 3B:
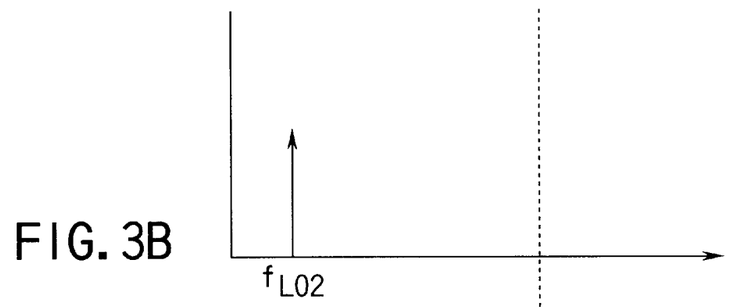
Figure 3C:
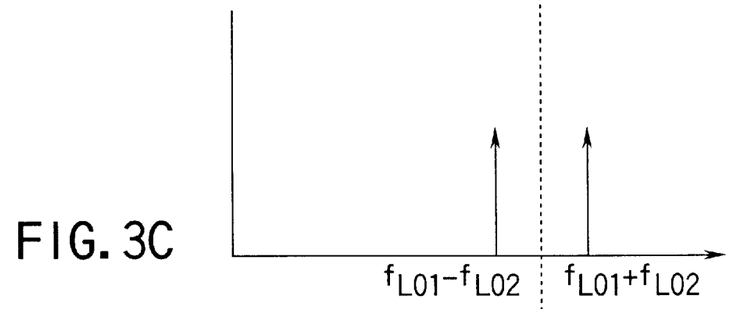
Figure 3D:
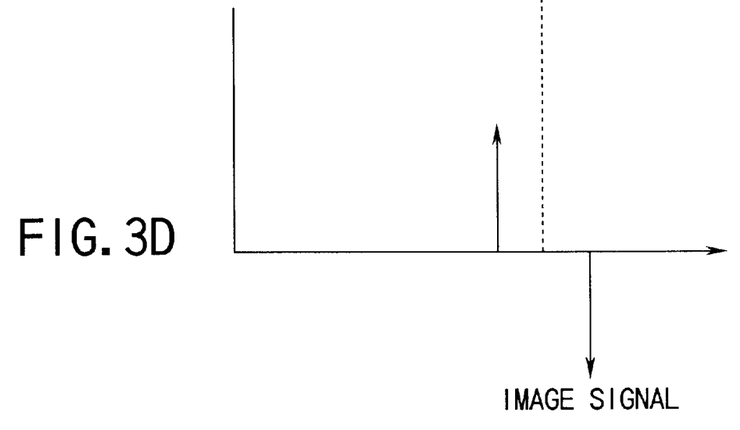

FIG. 3A indicates a first local oscillation signal of frequency $f_{LO1}$ which is generated by the first local signal oscillator 26, and FIG. 3B indicates a second local oscillation signal of frequency $f_{LO2}$ which is generated by the second local signal oscillator 27. FIG. 3C indicates a signal obtained by multiplying a signal cos $\omega_{LO1}t$ from the quadrature phase shifter 31 by a signal cos $\omega_{LO2}t$ from the quadrature phase shifter 32 by the multiplier 28. FIG. 3D indicates signals (having frequencies $f_{LO1}+f_{LO2}$ and $f_{LO1}-f_{LO2}$) obtained by multiplying the first and second local oscillation signals having the frequencies $f_{LO1}$ and $f_{LO2}$[Hz], respectively. By subtracting these signals, the image signal component is removed.

Figure 4A:
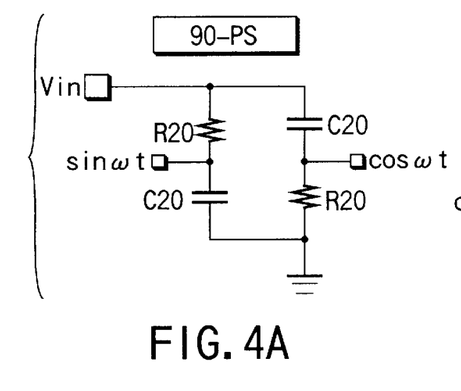
FIGS. 4A to 4C are circuit diagrams showing some examples of the quadrature phase shifter used in the circuit in FIG. 2.
Figure 4B:
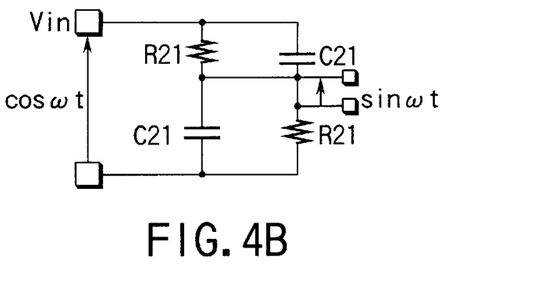
Figure 4C:
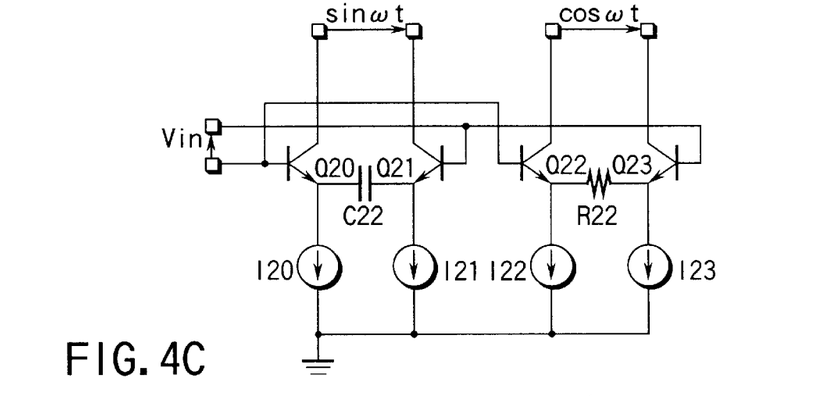

FIGS. 4A, 4B, and 4C show examples of quadrature phase shifters which are generally used. The phase shifter in FIG. 4A has high phase accuracy but produces an amplitude error due to manufacturing variations. The phase shifter in FIG. 4B has high amplitude accuracy but produces a phase error due to manufacturing variations. The phase shifter in FIG. 4C deteriorates in phase and amplitude accuracy due to manufacturing variations but has an amplification function. Although these phase shifters have their own characteristics, the present invention may use any one of them as needed.

A signal processing for an image rejection enables to provide an attenuation of 50 dB or more with respect to a desired wave. In the above signal processing, however, this filter may provide only an attenuation of about 40 dB due to manufacturing variations. In this case as well, leakage of an image signal and local oscillation signals can be sufficiently suppressed by using the narrow-band frequency characteristics of the power amplifier 25 in FIG. 1. In addition, if a bandpass filter made up of a spiral inductor and a capacitor in an IC is added to the output stage of the local oscillation signal generator 17, an unwanted wave can be suppressed by about 10 dB with respect to a desired wave. By suppressing an image signal using the local oscillation signal generator 17 in FIG. 2, the external image removing filter can be omitted.

In the local oscillation signal generator 17 in the present invention, the local oscillation signal from which the image signal is removed is divided into quadrature signals cos and sin again by a quadrature phase shifter (90-PS3) 33. The quadrature signals cos and sin are supplied to the quadrature modulator 23.

No special problem is posed even if the filter in FIG. 4A used as this quadrature phase shifter. All the circuits described so far can be integrated into an IC, and an image signal can be suppressed without using any external image removing filter. Therefore, the radio unit can be reduced in size and cost.

Figure 5:
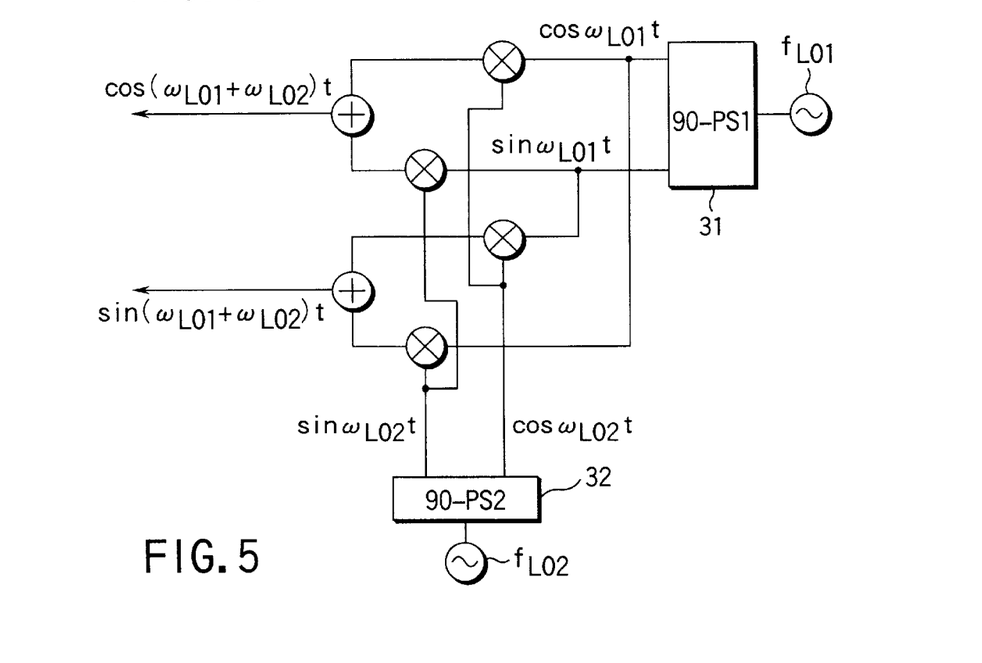
FIG. 5 is a circuit diagram showing a local oscillation signal generator according to another embodiment of the present invention.

FIG. 5 shows the arrangement of a modification of the local oscillation signal generator shown in FIG. 2. This local oscillation signal generator is structured by a circuit including a multiplier and an adder, in stead of the quadrature phase shifter. The circuit using the multiplier and adder generates two local oscillation signals having a phase difference of 90° therebetween similarly to the quadrature shifter 33. The signal processing corresponding to the newly added portions with respect to the arrangement in FIG. 2 can be described by:

$$\sin(\omega_{LO1}t)\cos(\omega_{LO2}t)+\cos(\omega_{LO1}t)\sin(\omega_{LO2}t)=\sin[(\omega_{LO1}+\omega_{LO2})t] \quad (2)$$

Apparently, the signals represented by equations (1) and (2) are quadrature in phase. With this processing, a desired local oscillation signal can be obtained without requiring any external image removing filter, as in the embodiment shown in FIG. 2.

An example of the arrangement for the generation of a local oscillation signal having undergone image signal removal in the present invention will be described below.

Figure 6:
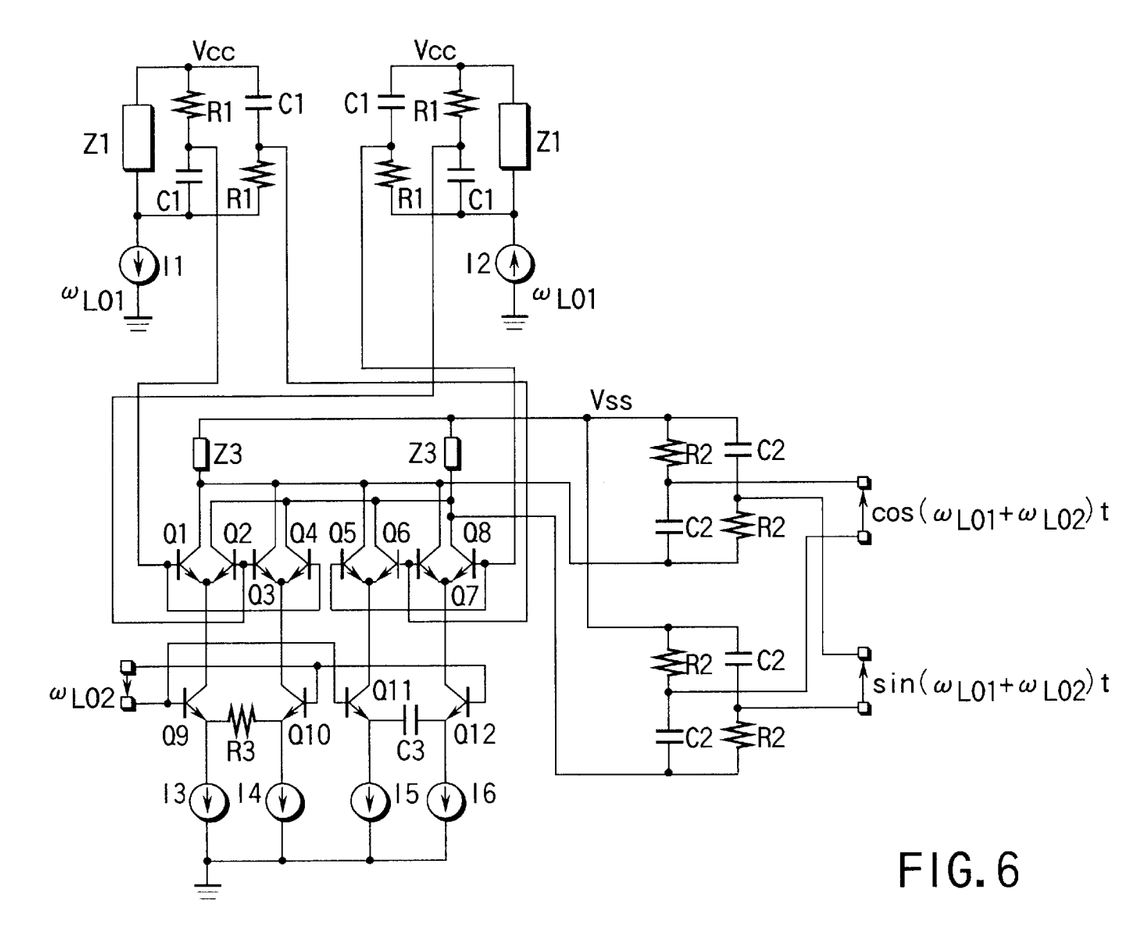
FIG. 6 is a circuit diagram showing a detailed arrangement of the local oscillation signal generator in FIG. 2.

FIG. 6 is a circuit diagram showing the detailed arrangement of the local oscillation signal generator 17 in the present invention in FIG. 2. A phase shifter made up of a resistor R1 and a capacitor C1 in FIG. 4A is used to generate a signal phase-shifted by 90 degrees from the signal having the frequency $f_{LO1}$ [Hz] ($\omega_{LO1}[=2\pi f_{LO1}]$ in FIG. 6). A phase shifter made up of transistors Q9 to Q12, a capacitor C3, and a resistor R3 in FIG. 4C is used to generate a signal phase-shifted by 90 degrees from the signal having the frequency $f_{LO2}$ [Hz] ($\omega_{LO2}[=2\pi f_{LO2}]$ in FIG. 6). A double balance mixer (DBM) made up of transistors Q1 to Q4, the transistors Q9 and Q10, the resistor R3, and the current sources I3 and I4 and designed to multiply one of the signals having the frequency $f_{LO1}$ [Hz] and phase-shifted by 90 degrees and one of the signals having the frequency $f_{LO2}$ [Hz] and phase-shifted by 90 degrees is connected in parallel with a double balance mixer (DBM) made up of transistors Q5 to Q1, a transistor Q11, the transistor Q12, the capacitor C3, and the current sources I5 and I6 and designed to multiply the other of the signals having the frequency $f_{LO1}$ [Hz] and phase-shifted by 90 degrees and the other of the signals having the frequency $f_{LO2}$ [Hz] and phase-shifted by 90 degrees. With this arrangement, the respective products are subtracted from each other. Note that a load Z3 is common to the two DBMs, and each DBM has a phase shifter in FIG. 4C which phase-shifts the signal having the frequency $f_{LO2}$ [Hz] by 90 degrees, as described above. The local oscillation signal generated by the parallel-connected DBMs is phase-shifted by 90 degrees by the phase shifter in FIG. 4A. The DBMs and the quadrature phase shifters can be integrated into an IC, and hence the image signal in the local oscillation signal input to the transmitter unit can be suppressed without using any external image removing filter.

Figure 7:
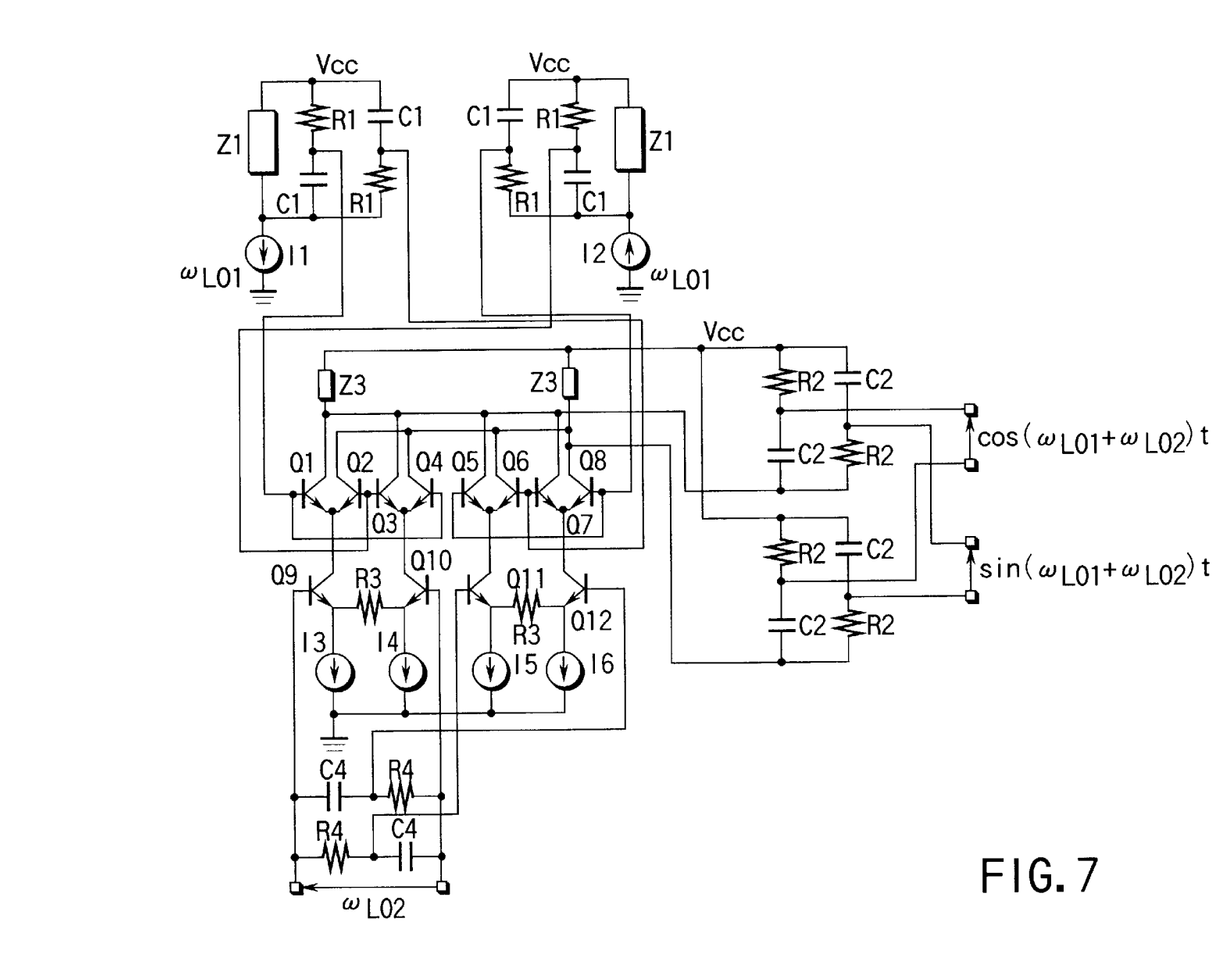
FIG. 7 is a circuit diagram showing another detailed arrangement of the local oscillation signal generator in FIG. 2.

FIG. 7 shows another example of the present invention shown in FIG. 2. This arrangement differs from the arrangement shown FIG. 6 in that the quadrature phase shifter made up of the resistor R4 and the capacitor C4 shown in FIG. 4B is used to phase-shift the signal having the frequency $f_{LO2}$ [Hz] by 90 degrees. In this case, elements connected between the emitters of differential circuits on the lower stage of a DBM have the same impedance. Although the resistor R3 is used in this embodiment, no special problem is posed as long as an element having a linear impedance, e.g., a capacitor or inductor, is used.

Figure 8:
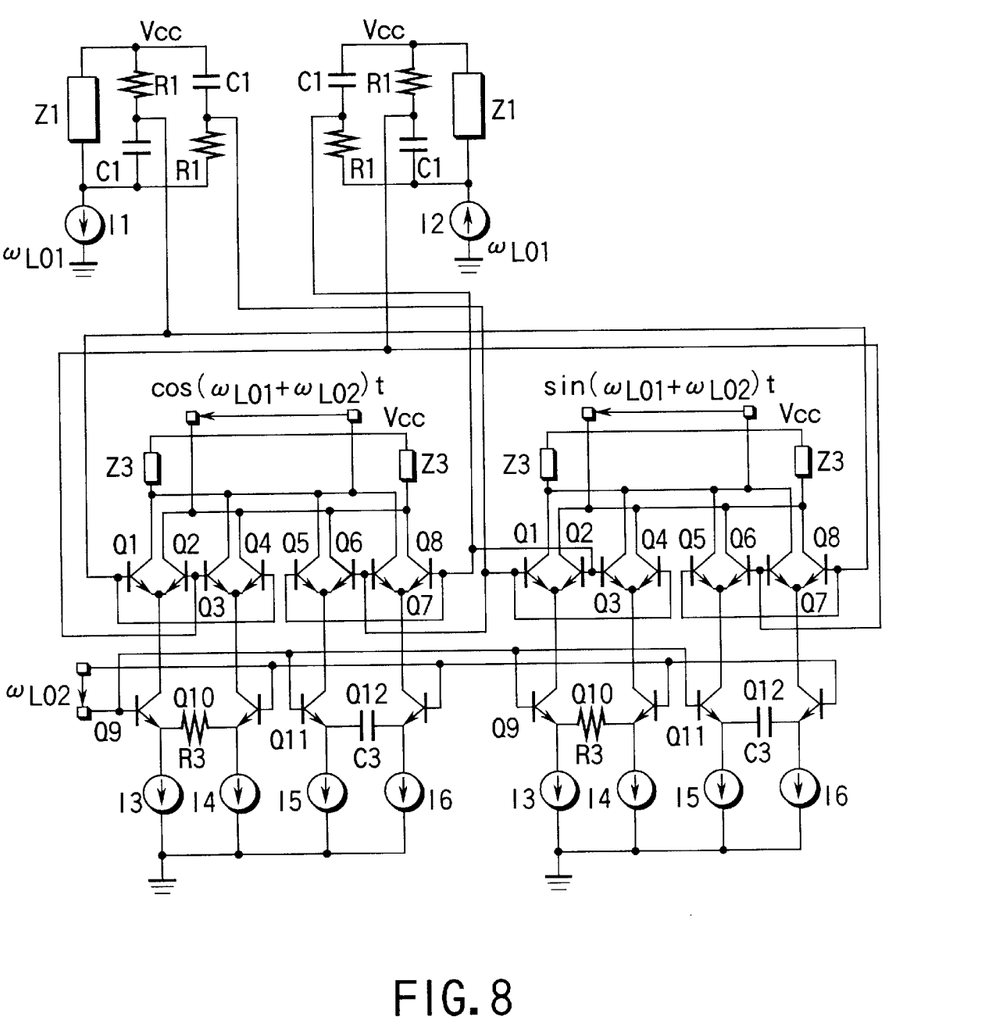
FIG. 8 is a circuit diagram showing a detailed arrangement of a local oscillation signal generator in FIG. 4.

FIG. 8 shows an example of the local oscillation signal generator in this embodiment in FIG. 5. To generate a signal phase-shifted by 90 degrees from the signal having the frequency $f_{LO1}$ [Hz] ($\omega_{LO1}[=2\pi f_{LO1}]$ in FIG. 8), the phase shifter made up of a resistor R1 and a capacitor C1 shown in FIG. 4A is used. To generate a signal phase-shifted by 90 degrees from the signal having the frequency $f_{LO2}$ [Hz] ($\omega_{LO2}[=2\pi f_{LO2}]$ in FIG. 8), the phase shifter made up of the transistors Q9 to Q12, the capacitor C3, and the resistor R3 in FIG. 4C is used. One double balance mixer (DBM) for multiplying one of the signals having the frequency $f_{LO1}$ [Hz] and phase-shifted by 90 degrees and one of the signals having the frequency $f_{LO2}$ and phase-shifted by 90 degrees is connected in parallel with the other double balance mixer (DBM) for multiplying the other of the signals having the frequency $f_{LO1}$ [Hz] and phase-shifted by 90 degrees and the other of the signals having the frequency $f_{LO2}$[Hz] and phase-shifted by 90 degrees. With this arrangement, the respective products are subtracted from each other. One double balance mixer (DBM) is made up of the transistors Q1 to Q4, Q9, and Q10, the resistor R3, and the current sources I3 and I4. The other double balance mixer (DBM) is made up of the transistors Q5 to Q8, Q11, and Q12, the capacitor C3, and the current sources I5 and I6. Note that the load Z3 is common to the two DBMs, and each DBM has the phase shifter shown in FIG. 4C, which shifts the phase of the signal having the frequency $f_{LO2}$ [Hz] by 90 degrees. This embodiment is characterized in that another pair of parallel-connected DBMs having the same circuit arrangement as that of the above pair of parallel-connected DBMs is added. Note that local oscillation signals obtained by shifting the phase of the signal having the frequency $f_{LO1}$ [Hz] are input to the bases of the transistors Q1 to Q4 and the transistors Q5 to Q8 of the two parallel-connected DBMs to satisfy equations (1) and (2). As a result, the outputs from the two parallel-connected DBMS become local oscillation signals which have a phase difference of 90 degrees. In this arrangement, therefore, the image signal in each local oscillation signal can be suppressed without using any external image removing filter, as in the circuits shown in FIGS. 6 and 7.

Figure 9:
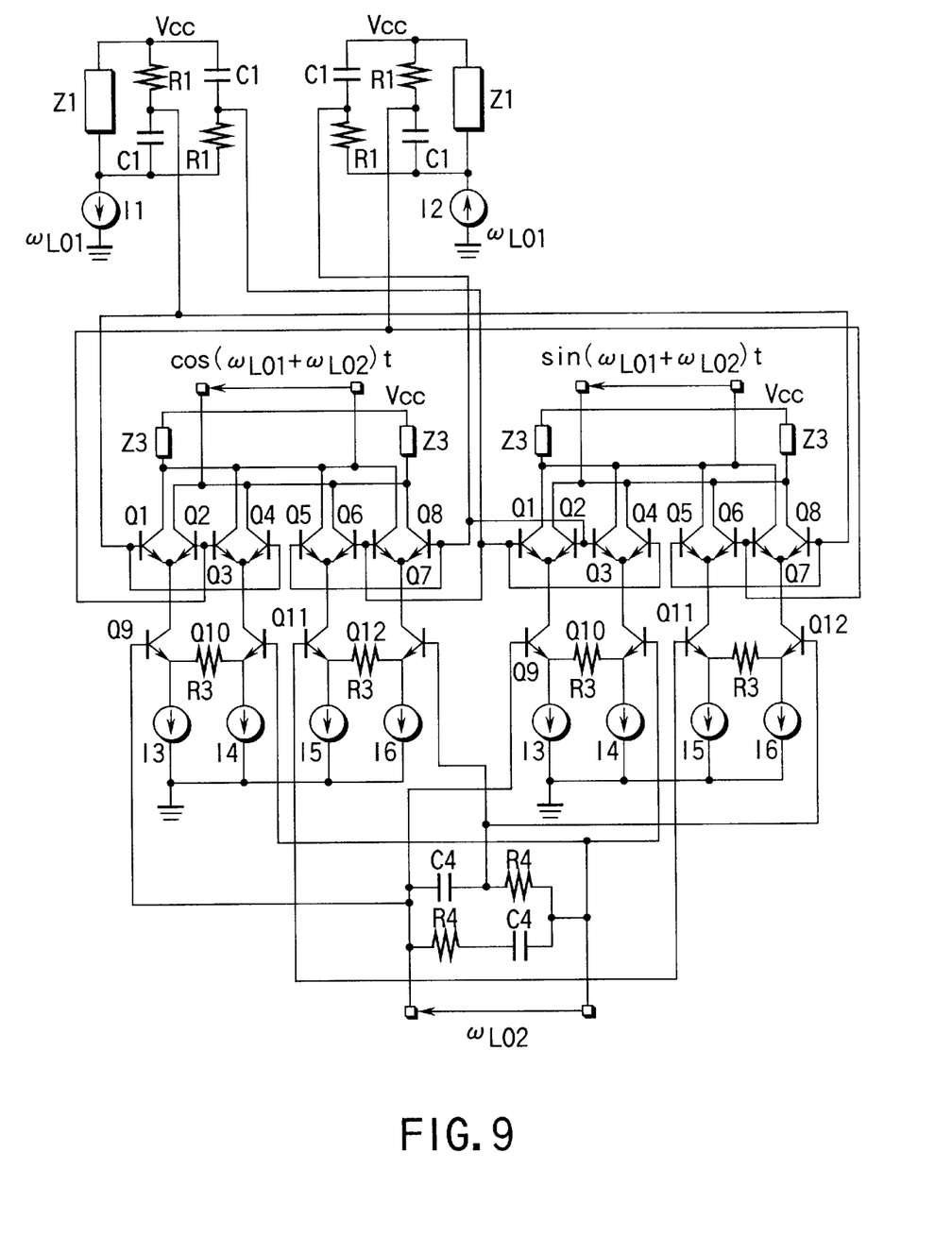
FIG. 9 is a circuit diagram showing another detailed arrangement of the local oscillation signal generator in FIG. 4.

FIG. 9 shows another example of the local oscillation signal generator according to the present invention in FIG. 5. This arrangement differs from that shown in FIG. 8 in that the quadrature phase shifter made up of the resistor R4 and the capacitor C4 in FIG. 4B is used to shift the phase of the signal having the frequency $f_{LO2}$ by 90 degrees. In this case, elements connected between the emitters of differential circuits on the lower stage of a DBM have the same impedance. Although the resistor R3 is used in this embodiment, no special problem is posed as long as an element having a linear impedance, e.g., a capacitor or inductor, is used.

According to the above description, the arrangement for generating the signal having the frequency $f_{LO1}+f_{LO2}$ [Hz] or $f_{LO1}-f_{LO2}$ [Hz] having undergone image signal suppression by using the local oscillation signals having the frequencies $f_{LO1}$ and $f_{LO2}$ [Hz] is applied to the transmitter unit. However, this technique can be applied to the generation of local oscillation signal in the receiver unit. In this case, according to the principle of the present invention, a received RF signal is directly converted into a baseband signal without using any image removing filter.

In the above embodiment, the reception system uses the superheterodyne scheme, and the transmission system uses the direct conversion scheme. An embodiment in which both the transmission and reception systems use direct conversion will be described next.

Figure 10:
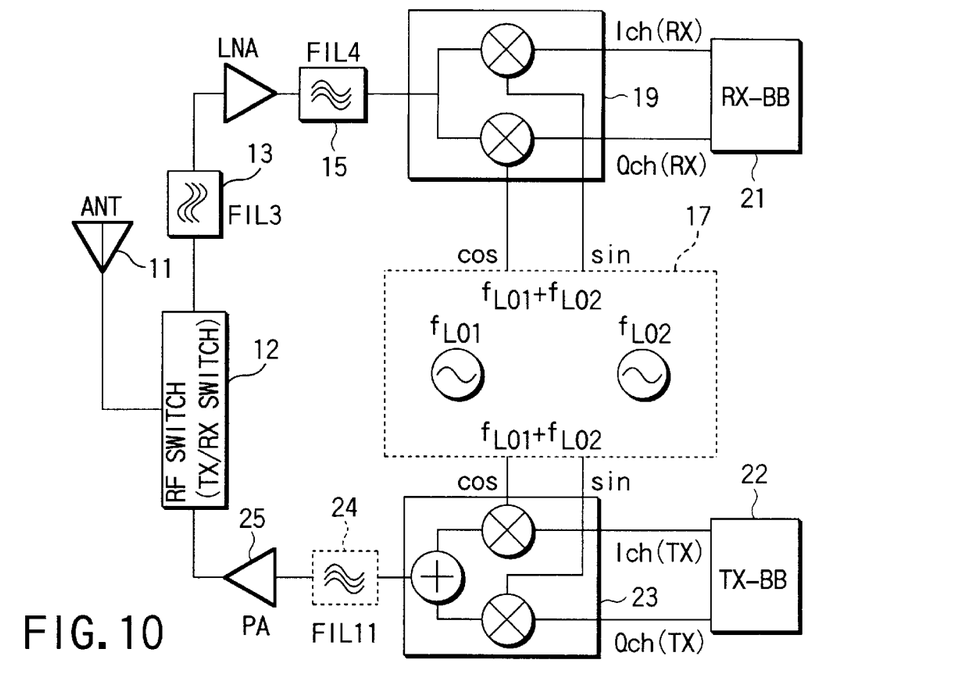
FIG. 10 is a block diagram showing a radio apparatus using the local oscillation signal generator according to another embodiment of the present invention, in which the direct conversion scheme is used for the transmission and reception systems.

The embodiment shown in FIG. 10 is a radio apparatus using a frequency $f_{LO1}+f_{LO2}$ [Hz]. This radio apparatus is applied to a PHS (Personal Handyphone System) using the same frequency for transmission and reception. According to this arrangement, a local oscillation signal generator 17 supplies local oscillation signals having the same frequency $f_{LO1}+f_{LO2}$ [Hz] to a receiver quadrature demodulator 19 and a transmitter quadrature modulator 23. In this embodiment as well, local oscillation signals for transmission and reception can be generated without using any image removing filter. Note that the local oscillation signal generator 17 may supply local oscillation signals having a frequency $f_{LO1}-f_{LO2}$ [Hz] to the receiver quadrature demodulator 19 and the transmitter quadrature modulator 23.

An embodiment of a radio apparatus that can be used for a system using different transmission and reception frequencies will be described next. In this embodiment, a local oscillation signal having a frequency $f_{LO1}+f_{LO2}$ [Hz] can be changed into a local oscillation signal having a frequency $f_{LO1}-f_{LO2}$ by performing addition of frequencies instead of subtraction of frequencies. More specifically, if the desired frequency is set to $f_{LO1}+f_{LO2}$ in the transmission system, a signal having the frequency $f_{LO1}-f_{LO2}$ [Hz] is an image signal, which is to be removed. In contrast to this, in the reception system, the desired frequency is set to $f_{LO1}-f_{LO2}$, and an image signal having the frequency $f_{LO1}+f_{LO2}$ [Hz] is removed.

Figure 11:
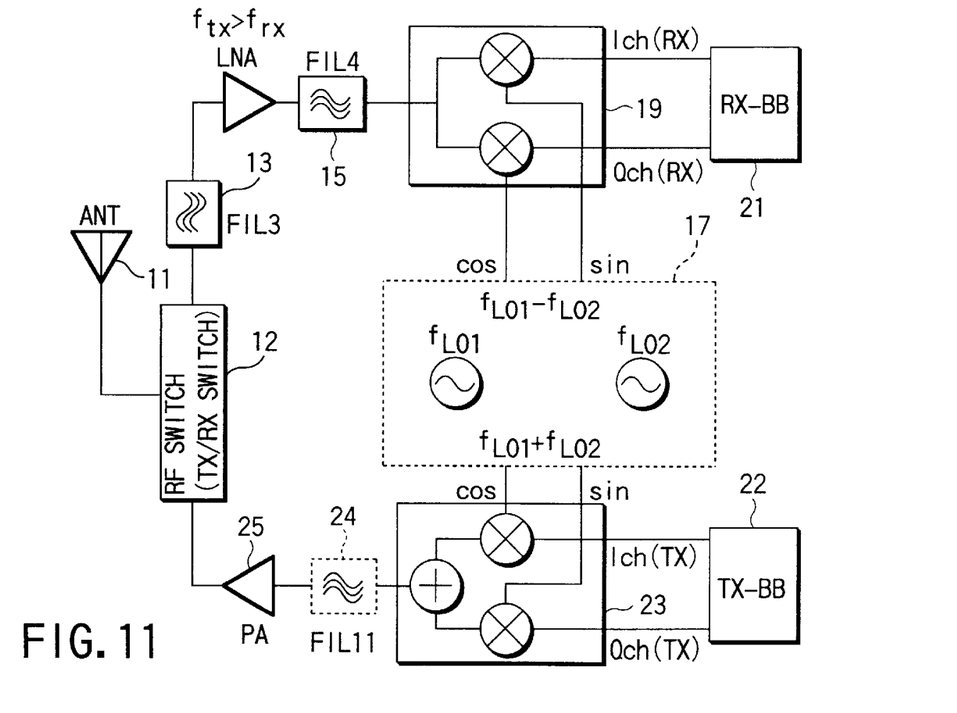
FIG. 11 is a block diagram showing a radio apparatus using the local oscillation signal generator according to another embodiment of the present invention, in which the direct conversion scheme is used for the transmission and reception systems.

For example, in the embodiment shown in FIG. 11 in which transmission frequency $f_{TX}$ [Hz]>reception frequency $f_{RX}$ [Hz], frequencies $f_{LO1}$ and $f_{LO2}$ [Hz] are selected to obtain the frequencies given by $$f_{LO1}+f_{LO2}=f_{TX}$$

$$f_{LO1}-f_{LO2}=f_{RX}$$

and an image signal having a frequency $f_{LO1}-f_{LO2}$ for the transmitter and an image signal having a frequency $f_{LO1}+f_{LO2}$ for the receiver are removed. With this operation, local frequency signals for transmission and reception can be generated without using any image removing filter.

Figure 12:
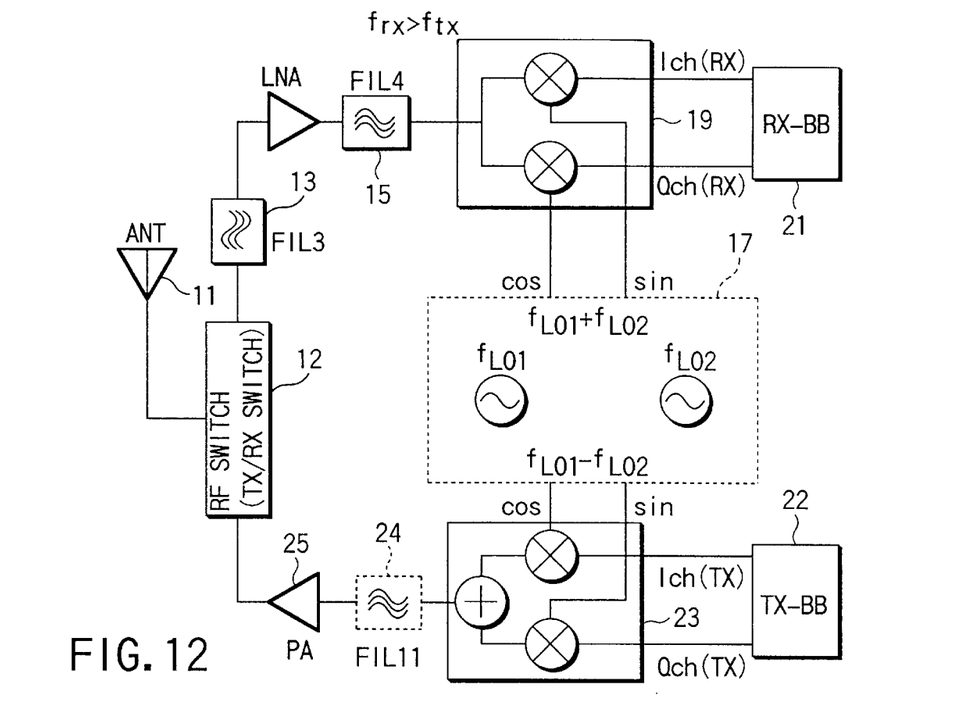
FIG. 12 is a block diagram showing a radio apparatus using the local oscillation signal generator according to another embodiment of the present invention, in which the direct conversion scheme is used for the transmission and reception systems.

In addition, as shown in FIG. 12, in an embodiment in which reception frequency $f_{RX}$ [Hz]>transmission frequency $f_{TX}$ [Hz], frequencies $f_{LO1}$ and $f_{LO2}$ [Hz] are selected to obtain the frequencies given by $$f_{LO1}-f_{LO2}=f_{TX}$$

$$f_{LO1}+f_{LO2}=f_{RX}$$

and an image signal having a frequency $f_{LO1}+f_{LO2}$ for the transmitter and an image signal having a frequency $f_{LO1}+f_{LO2}$ for the receiver are removed. In this case as well, local frequency signals for transmission and reception can be generated without using any image removing filter.

In the embodiments described above, bipolar transistors are used as active elements. However, a similar circuit can be formed by using field-effect transistors such as MOSFETs or MESFETs.

According to the above method, image suppression signal processing obviates the necessity for using any image suppression filter. Direct conversion also requires no image suppression filter according to its principle. A radio unit using direct conversion includes a modulation unit for obtaining an RF signal from quadrature I/Q baseband signals through one frequency conversion and a demodulation unit for obtaining quadrature I/Q baseband signals from an RF signal through one frequency conversion.

Figure 13:
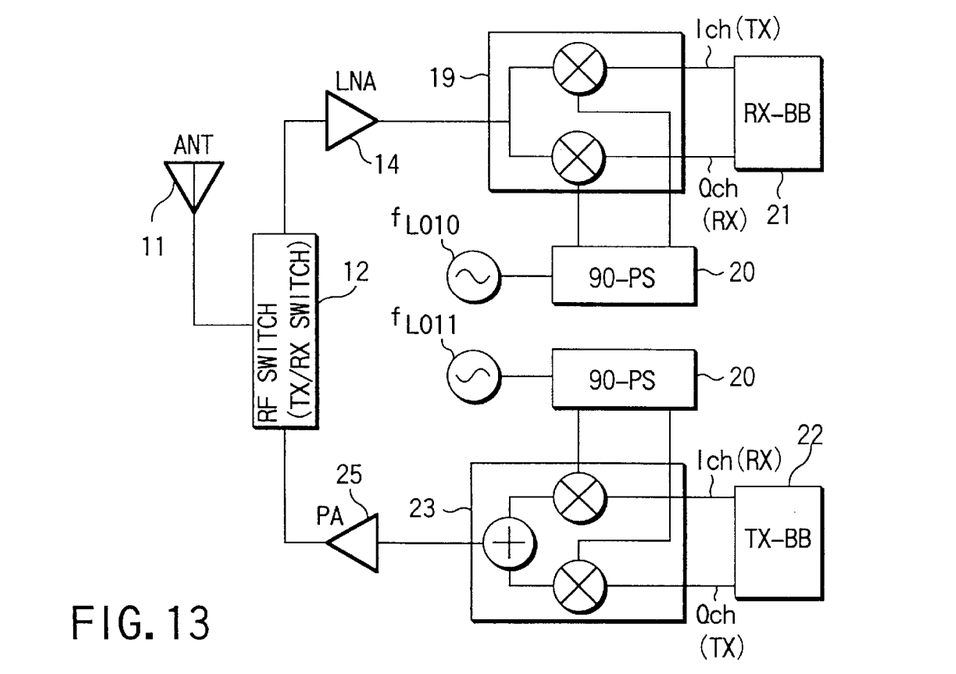
FIG. 13 is a circuit diagram showing a radio apparatus using the direct conversion scheme according to still another embodiment of the present invention.

FIG. 13 is a block diagram showing transmission and reception systems independently having a transmission frequency oscillator and a reception frequency oscillator. According to this arrangement, in the reception system, an antenna 11 is connected to a low-noise amplifier 14 through an RF switch 12. An output from the low-noise amplifier 14 is input to a baseband processor (RX-BB) 21 through a quadrature demodulator 19.

In the transmission system, a baseband signal processor (TX-BB) 22 is connected to the RF switch 12 through a quadrature modulator 23 and a power amplifier (PA) 25. The receiver quadrature demodulator 19 and the transmitter quadrature modulator 23 respectively receive second, quadrature local oscillation signals having a frequency $f_{LO3}$ [Hz] from quadrature phase shifters 20. The frequency $f_{LO3}$ [Hz] is an oscillation frequency ($f_{LO10}$ [Hz] or $f_{LO11}$ [Hz]) of the local oscillation generator shown in FIG. 13.

The above arrangement obviates the necessity for using any image suppression filter and can be applied to a case wherein the transmission and reception frequencies differ. In this case, the frequency $f_{LO10}$ is different from the frequency $f_{LO11}$. In addition, the transmitter and receiver units can simultaneously operate, and only two local oscillators are required as in the superheterodyne scheme. These advantages provide the same effect as that obtained by using image suppression.

The present invention can obviate the necessity for using any external image removing filter, and achieve reductions in the size and cost of a radio unit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radio apparatus comprising: a local signal generator comprising,
   an oscillation circuit adapted to generate at least a first local oscillation signal having a first frequency and a second local oscillation signal having a second frequency,
   a first signal generator adapted to generate from the first local oscillation signal third and fourth local oscillation signals having a phase difference of 90 degrees therebetween, and
   a second signal generator adapted to generate from the second local oscillation signal fifth and sixth local oscillation signals having a phase difference of 90 degrees therebetween; and at least one of
   a transmitter unit including a section adapted to multiply the third local oscillation signal by the fifth local oscillation signal to obtain a first multiplication result, to multiply the fourth local oscillation signal by the sixth local oscillation signal to obtain a second multiplication result, and to add or subtract the first multiplication result and the second multiplication result in order to obtain a seventh oscillation signal having a suppressed image component, and
   a receiver unit adapted to demodulate using the seventh local oscillation signal.

2. A device according to claim 1, wherein said transmitter unit performs modulation by using the seventh local oscillation signal generated by subtracting the first multiplication result and the second multiplication result, and said receiver unit performs demodulation by using the seventh local oscillation signal generated by adding the first multiplication result and the second multiplication result.

3. A device according to claim 1, wherein said transmitter unit performs modulation by using the seventh local oscillation signal generated by adding the first multiplication result and the second multiplication result, and said receiver unit performs modulation by using the seventh local oscillation signal generated by subtracting the first multiplication result and the second multiplication result.

4. A device according to claim 1, further comprising a third signal generator which generates from the seventh local oscillation signal eighth and ninth local oscillation signals having a phase difference of 90 degrees therebetween, wherein said transmitter unit is adapted to generate a modulated signal by using two quadrature baseband signals or modulation signals and the eighth and ninth local oscillation signals and said receiver unit is adapted to demodulate using the modulated signal and the eighth and ninth local oscillation signals.

5. A device according to claim 4, wherein said transmitter unit performs modulation by using the seventh local oscillation signal generated by subtracting the first multiplication result and the second multiplication result, and said receiver unit performs demodulation by using the seventh local oscillation signal generated by adding the first multiplication result and the second multiplication result.

6. A device according to claim 4, wherein said transmitter unit performs modulation by using the seventh local oscillation signal generated by adding the first multiplication result and the second multiplication result, and said receiver unit performs demodulation by using the seventh local oscillation signal generated by subtracting the first multiplication result and the second multiplication result.

7. A device according to claim 1, wherein said local signal generator comprises:
   an arithmetic unit including a first double balance mixer adapted to multiply the third and fifth local oscillation signals and formed into an IC;
   a second double balance mixer adapted to multiply the fourth and sixth local oscillation signals and formed into an integrated circuit device; and
   a connecting section adapted to connect said first and second double balance mixers in parallel to add or subtract the first multiplication result and the second multiplication result.

8. A device according to claim 1, wherein:
   said local signal generator includes a third signal generator adapted to generate an eighth local oscillation signal 90 degrees out of phase from the seventh local oscillation signal by multiplying the third and sixth local oscillation signals, multiplying the fourth and fifth local oscillation signals, and adding or subtracting the first multiplication result and the second multiplication result;
   said transmitter unit includes a transmitter unit adapted to generate a modulated signal by the seventh and eighth local oscillation signals and two quadrature baseband signals or modulation signals; and
   said receiver unit includes a receiver unit adapted to demodulate using the modulated signal and the seventh and eighth local oscillation signals.

9. A device according to claim 8, wherein said transmitter unit performs modulation by using the seventh local oscillation signal generated by subtracting the first multiplication result and the second multiplication result, and said receiver unit performs demodulation by using the seventh local oscillation signal generated by adding the first multiplication result and the second multiplication result.

10. A device according to claim 8, wherein said transmitter unit performs modulation by using the seventh local oscillation signal generated by adding the first multiplication result and the second multiplication result, and said receiver unit performs demodulation by using the seventh local oscillation signal generated by subtracting the first multiplication result and the second multiplication result.

11. A device according to claim 8, wherein said local signal generator includes an arithmetic unit comprising:
   a first double balance mixer adapted to multiply the third and fifth local oscillation signals and formed into an IC;
   a second double balance mixer adapted to multiply the fourth and sixth local oscillation signals and formed into an integrated circuit device;

a first connecting portion adapted to connect said first and second double balance mixers in parallel to add or subtract the first multiplication result and the second multiplication result;

a third double balance mixer adapted to multiply the third and sixth local oscillation signals and formed into an IC;

a fourth double balance mixer adapted to multiply the fourth and fifth local oscillation signals and formed into an IC; and a second connecting portion adapted to connect said third and fourth double balance mixers in parallel to add or subtract the first multiplication result and the second multiplication result.

12. A radio apparatus comprising:

an oscillation circuit adapted to generate a first local oscillation signal having a first frequency and a second local oscillation signal having a second frequency;

a first signal generator adapted to generate from the first local oscillation signal third and fourth local oscillation signals having a phase difference of 90 degrees therebetween;

a second signal generator adapted to generate from the second local oscillation signal fifth and sixth local oscillation signals having a phase difference of 90 degrees therebetween;

a third signal generator adapted to generate a seventh local oscillation signal by adding or subtracting a first multiplication result of the third and fifth local oscillation signals and a second multiplication result of the fourth and sixth local oscillation signals;

a fourth signal generator adapted to generate using the seventh local oscillation signal eighth and ninth local oscillation signals having a phase difference of 90 degrees and respective suppressed image components;

a transmitter unit adapted to modulate using the eighth and ninth local oscillation signals; and a receiver unit adapted to demodulate using the eighth and ninth local oscillation signals.

13. A device according to claim 12, wherein said third signal generator includes an arithmetic unit comprising:

a first double balance mixer adapted to multiply the third and fifth local oscillation signals and formed into an IC;

a second double balance mixer adapted to multiply the fourth and sixth local oscillation signals and formed into an integrated circuit device; and a connecting portion adapted to connect said first and second double balance mixers in parallel to add or subtract the first and second multiplication results.

14. A device according to claim 12, wherein:

said fourth signal generator includes means for generating an eighth local oscillation signal 90 degrees out of phase from the seventh local oscillation signal by multiplying the third and sixth local oscillation signals to obtain a first multiplication result, multiplying the fourth and fifth local oscillation signals to obtain a second multiplication result, and adding or subtracting the first and second multiplication results;

said transmitter unit includes a transmitter adapted to generate a modulated signal by the seventh and eighth local oscillation signals and two quadrature baseband signals or modulation signals; and said receiver unit includes a receiver adapted to demodulate using the modulated signal and the seventh and eighth local oscillation signals.

15. A device according to claim 14, wherein said third signal generator includes an arithmetic unit comprising:

a first double balance mixer adapted to multiply the third and fifth local oscillation signals and formed into an IC;

a second double balance mixer adapted to multiply the fourth and sixth local oscillation signals and formed into an IC;

a connecting portion adapted to connect said first and second double balance mixers in parallel to add or subtract the first and second multiplication results;

a third double balance mixer adapted to multiply the third and sixth local oscillation signals and formed into an integrated circuit device;

a fourth double balance mixer adapted to multiply the fourth and fifth local oscillation signals and formed into an integrated circuit device; and a connecting portion adapted to connect said third and fourth double balance mixers in parallel to add or subtract the first and second multiplication results.

16. A device according to claim 12, wherein:

said fourth signal generator includes a phase shifter adapted to generate an eighth local oscillation signal 90 degrees out of phase from the seventh local oscillation signal by multiplying the third and sixth local oscillation signals to obtain a first multiplication result, multiplying the fourth and fifth local oscillation signals to obtain a second multiplication result, and adding or subtracting the first and second multiplication results;

said transmitter unit includes a transmitter adapted to generate a modulated signal by the seventh and eighth local oscillation signals and two quadrature baseband signals or modulation signals; and said receiver unit includes a receiver adapted to demodulate using the modulated signal and the seventh and eighth local oscillation signals.

* * * * *